(12) United States Patent
Liu et al.

(10) Patent No.: US 8,753,902 B1
(45) Date of Patent: Jun. 17, 2014

(54) METHOD OF CONTROLLING ETCHING PROCESS FOR FORMING EPITAXIAL STRUCTURE

(71) Applicant: United Microelectronics Corp., Hsin-Chu (TW)

(72) Inventors: Chia-Jong Liu, Ping-Tung County (TW); Yen-Liang Wu, Taipei (TW); Chung-Fu Chang, Tainan (TW); Yu-Hsiang Hung, Tainan (TW); Pei-Yu Chou, Tainan (TW); Home-Been Cheng, Keelung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/802,494

(22) Filed: Mar. 13, 2013

(51) Int. Cl.
*G01R 31/26* (2014.01)

(52) U.S. Cl.
USPC .............................................. 438/14; 438/300

(58) Field of Classification Search
USPC .......................................... 438/14, 300, 303
See application file for complete search history.

(56) References Cited

U.S. PATENT DOCUMENTS

| | | | |
|---|---|---|---|
| 4,891,303 A | 1/1990 | Garza | |
| 5,217,910 A | 6/1993 | Shimizu | |
| 5,273,930 A | 12/1993 | Steele | |
| 5,356,830 A | 10/1994 | Yoshikawa | |
| 5,372,957 A | 12/1994 | Liang | |
| 5,385,630 A | 1/1995 | Philipossian | |
| 5,399,506 A | 3/1995 | Tsukamoto | |
| 5,625,217 A | 4/1997 | Chau | |
| 5,777,364 A | 7/1998 | Crabbe | |
| 5,783,478 A | 7/1998 | Chau | |
| 5,783,479 A | 7/1998 | Lin | |
| 5,960,322 A | 9/1999 | Xiang | |
| 6,030,874 A | 2/2000 | Grider | |
| 6,048,756 A | 4/2000 | Lee | |
| 6,074,954 A | 6/2000 | Lill | |
| 6,100,171 A | 8/2000 | Ishida | |
| 6,110,787 A | 8/2000 | Chan | |
| 6,165,826 A | 12/2000 | Chau | |
| 6,165,881 A | 12/2000 | Tao | |
| 6,191,052 B1 | 2/2001 | Wang | |
| 6,228,730 B1 | 5/2001 | Chen | |
| 6,274,447 B1 | 8/2001 | Takasou | |
| 6,355,533 B2 | 3/2002 | Lee | |
| 6,365,476 B1 | 4/2002 | Talwar | |
| 6,368,926 B1 | 4/2002 | Wu | |
| 6,444,591 B1 | 9/2002 | Schuegraf | |
| 6,537,370 B1 | 3/2003 | Hernandez | |
| 6,544,822 B2 | 4/2003 | Kim | |
| 6,605,498 B1 | 8/2003 | Murthy | |
| 6,613,695 B2 | 9/2003 | Pomarede | |
| 6,621,131 B2 | 9/2003 | Murthy | |
| 6,624,068 B2 | 9/2003 | Thakar | |
| 6,632,718 B1 | 10/2003 | Grider | |
| 6,642,122 B1 | 11/2003 | Yu | |

(Continued)

*Primary Examiner* — Bradley K Smith
(74) *Attorney, Agent, or Firm* — Winston Hsu; Scott Margo

(57) ABSTRACT

A method of controlling an etching process for forming an epitaxial structure includes the following steps. A substrate having a gate thereon is provided. A spacer is formed on the substrate beside the gate to define the position of the epitaxial structure. A thickness of the spacer is measured. The etching time of a first etching process is set according to the thickness. The first etching process is performed to form a recess in the substrate beside the spacer. The epitaxial structure is formed in the recess.

13 Claims, 3 Drawing Sheets

(56) References Cited

U.S. PATENT DOCUMENTS

| | | |
|---|---|---|
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,855,607 B2 | 2/2005 | Achuthan |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,013,446 B2 | 3/2006 | Ohba |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,250,658 B2 | 7/2007 | Doris |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,521,324 B2 | 4/2009 | Ohmi |
| 7,531,437 B2 | 5/2009 | Brask |
| 7,592,231 B2 | 9/2009 | Cheng |
| 7,592,270 B2 | 9/2009 | Teo |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0015365 A1 | 1/2007 | Chen |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0218661 A1 | 9/2007 | Shroff |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0057759 A1 | 3/2009 | Obradovic |
| 2009/0095992 A1 | 4/2009 | Sanuki |
| 2009/0117715 A1 | 5/2009 | Fukuda |
| 2009/0124056 A1 | 5/2009 | Chen |
| 2009/0124097 A1 | 5/2009 | Cheng |
| 2009/0166625 A1 | 7/2009 | Ting |
| 2009/0184402 A1 | 7/2009 | Chen |
| 2009/0186475 A1 | 7/2009 | Ting |
| 2009/0200494 A1 | 8/2009 | Hatem |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0044783 A1 | 2/2010 | Chuang |
| 2010/0048027 A1 | 2/2010 | Cheng |
| 2010/0093147 A1 | 4/2010 | Liao |
| 2010/0129994 A1 | 5/2010 | Awad |
| 2013/0130461 A1* | 5/2013 | Wang ............... 438/303 |
| 2013/0203188 A1* | 8/2013 | Vaid et al. ............ 438/14 |
| 2013/0256701 A1* | 10/2013 | Yang et al. ........... 257/77 |
| 2013/0299876 A1* | 11/2013 | Chen et al. .......... 257/192 |

* cited by examiner

METHOD OF CONTROLLING ETCHING PROCESS FOR FORMING EPITAXIAL STRUCTURE

BACKGROUND OF THE INVENTION

1. Field of the Invention

The present invention relates generally to a method of controlling an etching process for forming an epitaxial structure, and more specifically to a method of controlling an etching process for forming an epitaxial structure that adjusts the parameters of an etching process according to a thickness of a spacer to control the position of the formed epitaxial structure.

2. Description of the Prior Art

For decades, chip manufacturers have made metal-oxide-semiconductor (MOS) transistors faster by making them smaller. As the semiconductor processes advance to very deep sub micron era, such as the 65-nm node or beyond, how to increase the driving current for MOS transistors has become a critical issue. In order to improve devices performances, crystal strain technology has been developed. Crystal strain technology is becoming more and more attractive as a means for getting better performances in the field of MOS transistor fabrication. Putting a strain on a semiconductor crystal alters the speed at which charges move through that crystal. Strains make the CMOS transistors work better by enabling electrical charges, such as electrons, to pass more easily through the silicon lattice of the gate channel. In the known arts, attempts have been made to use a strained silicon layer that was grown epitaxially on a silicon substrate with a silicon germanium (SiGe) structure or a silicon carbide structure disposed in between. In this type of MOS transistor, a biaxial tensile strain occurs in the epitaxy silicon layer due to the silicon germanium structure or the silicon carbide structure having a larger or a smaller lattice constant than silicon, and, as a result, altering the band structure, thereby increasing the carrier mobility. This enhances the speed performances of the MOS transistors. Furthermore, the volume, the shape and the horizontal distance to gate of the epitaxial structure would also affect the electrical performances of the formed transistor.

SUMMARY OF THE INVENTION

The present invention provides a method of controlling an etching process for forming an epitaxial structure, which sets the etching time of the etching process according to a thickness of a spacer to form a recess for forming the epitaxial structure therein, so that the distance of the epitaxial structure to gate (i.e. the horizontal distance between the epitaxial structure and the gate) can be controlled.

The present invention provides a method of controlling an etching process for forming an epitaxial structure including the following steps. A substrate having a gate thereon is provided. A spacer is formed on the substrate beside the gate to define the position of the epitaxial structure. A thickness of the spacer is measured. The etching time of a first etching process is set according to the thickness. The first etching process is performed to form a recess in the substrate beside the spacer. The epitaxial structure is formed in the recess.

According to the above, the present invention provides a method of controlling an etching process for forming an epitaxial structure, which sets the etching time of the first etching process according to the thickness, to form a recess having a desired recess to gate distance (i.e. the horizontal distance between the recess and the gate). Moreover, the offset of the thickness of the spacer can be measured firstly, and the offset can be compensated by adjusting the etching time of the first etching process to form a predetermined distance of the epitaxial structure to gate. Therefore, the process can be controlled precisely and the desired epitaxial structure to gate distance can be obtained by applying the present invention, including offsets in the thickness of the spacer caused by unstable processing parameters or by the differences between different platform machines that can be compensated, thereby enhancing semiconductor structures, such as formed transistors, to be more accurate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
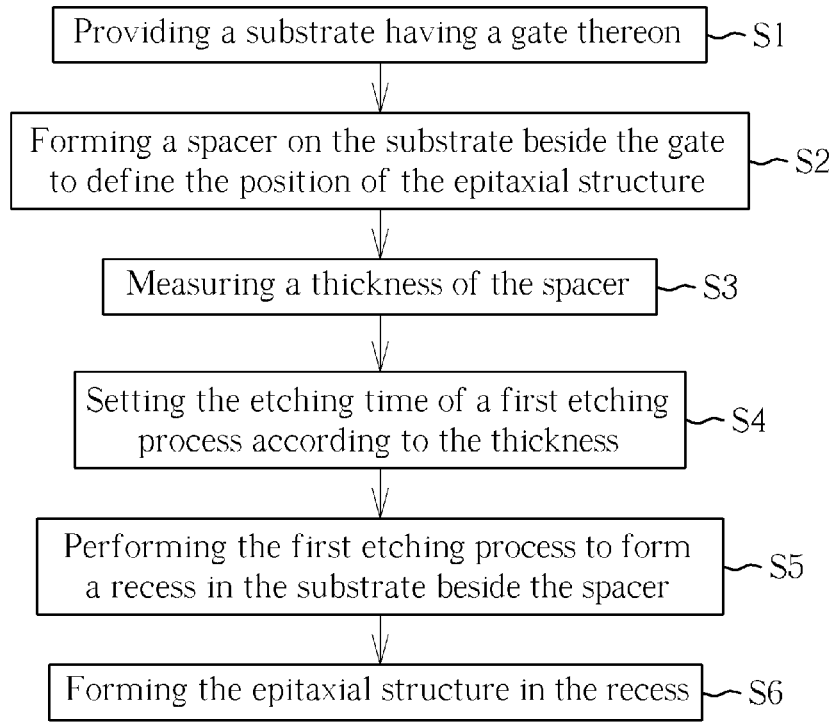
FIG. 1 schematically depicts a flow chart of a method of controlling an etching process for forming an epitaxial structure according to an embodiment of the present invention.

FIG. 1 schematically depicts a flow chart of a method of controlling an etching process for forming an epitaxial structure according to an embodiment of the present invention. Please refer to FIG. 1 and FIGS. 2-6.

Figure 5:
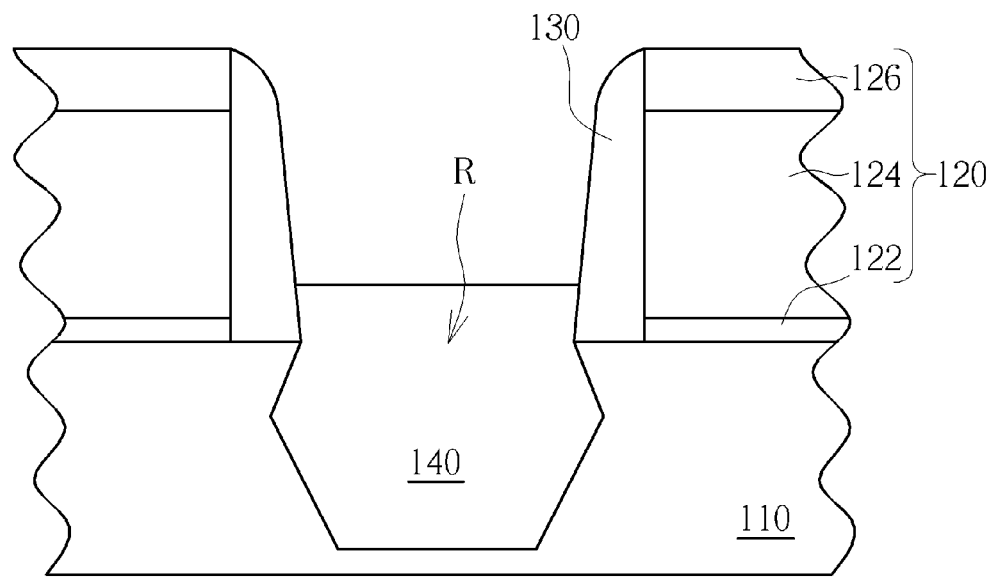
Figure 6:
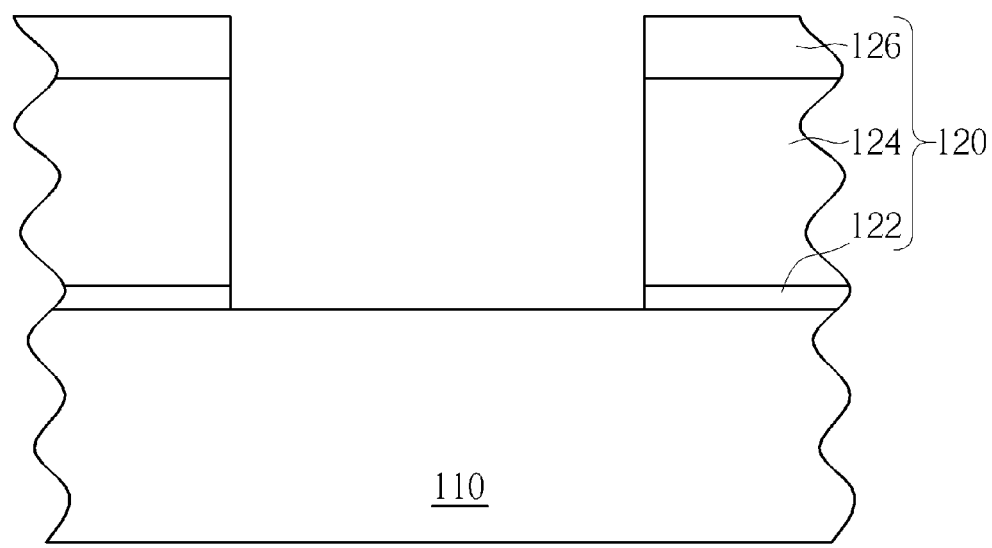

Please refer to the Step S1 of FIG. 1—providing a substrate having a gate thereon, which is illustrated in FIG. 6. A substrate 110 is provided, wherein the substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Two gates 120 are formed on the substrate 110. Each of the gates 120 may include a dielectric layer 122, an electrode layer 124 and a cap layer 126 stacked from bottom to top. More precisely, a dielectric layer (not shown), an electrode layer (not shown) and a cap layer (not shown) sequentially and entirely cover the substrate 110, and are then patterned to form the dielectric layer 122, the electrode layer 124 and the cap layer 126 stacked on the substrate 110. Two gates 120 are depicted in FIGS. 2-6, but the number of the gate 120 is not restricted to this. In another embodiment, the number of the gates 120 may be one or more than two, depending upon the needs.

The present invention can be applied to a polysilicon gate process, a gate-first process, a gate-last for high-K first process, a gate-last for high-K last with a buffer layer first process or a gate-last for high-K last with a buffer layer last process, etc. Thus, the dielectric layer 122 may include an oxide layer, a buffer layer or/and a dielectric layer having a high dielectric constant, but it is not limited thereto. For example, when the present invention is applied in a polysilicon gate process, the dielectric layer 122 is a dielectric suitable for a polysilicon gate such as an oxide layer; when the present invention is applied in a gate-first process or a gate-last for high-K first process, the dielectric layer 122 may include a buffer layer and a dielectric layer having a high dielectric constant; when the present invention is applied in a gate-last for high-K last with a buffer layer first process, the dielectric layer 122 may include a buffer layer and a sacrificial dielectric layer, wherein the sacrificial dielectric layer will be replaced by a dielectric layer having a high dielectric constant in a later performed metal gate replacement process; when the present invention is applied in a gate-last for high-K last with a buffer layer last process, the dielectric layer 122 may be a sacrificial dielectric layer, wherein the sacrificial dielectric layer will be replaced by a buffer layer and a dielectric layer having a high dielectric constant in a later performed metal gate replacement process. The buffer layer may be an oxide layer, which may be formed through a chemical oxide process or a thermal oxide process, or other processes. The dielectric layer having a high dielectric constant may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST).

Figure 2:
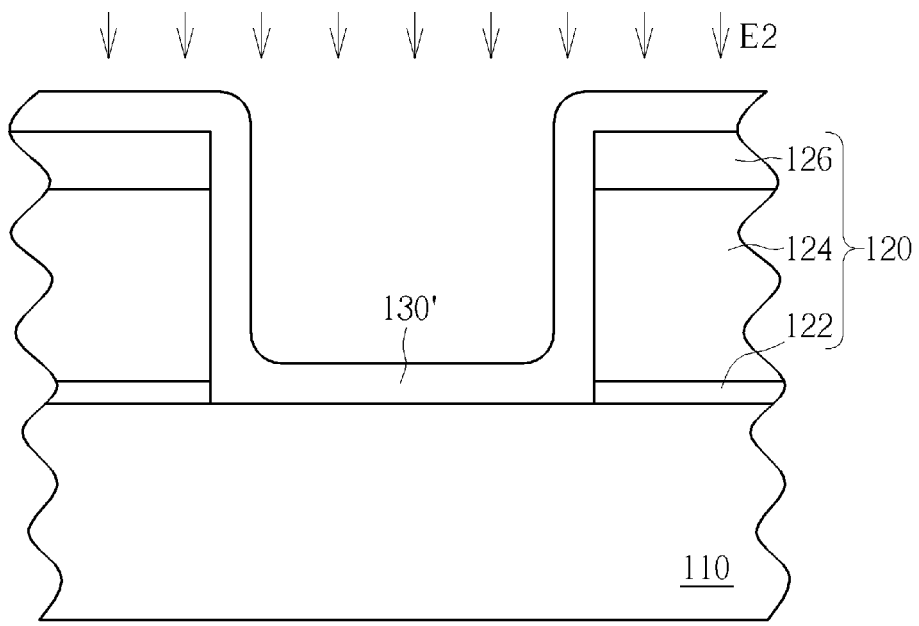
FIGS. 2-6 schematically depict cross-sectional views of a method of controlling an etching process for forming an epitaxial structure according to an embodiment of the present invention.
Figure 3:
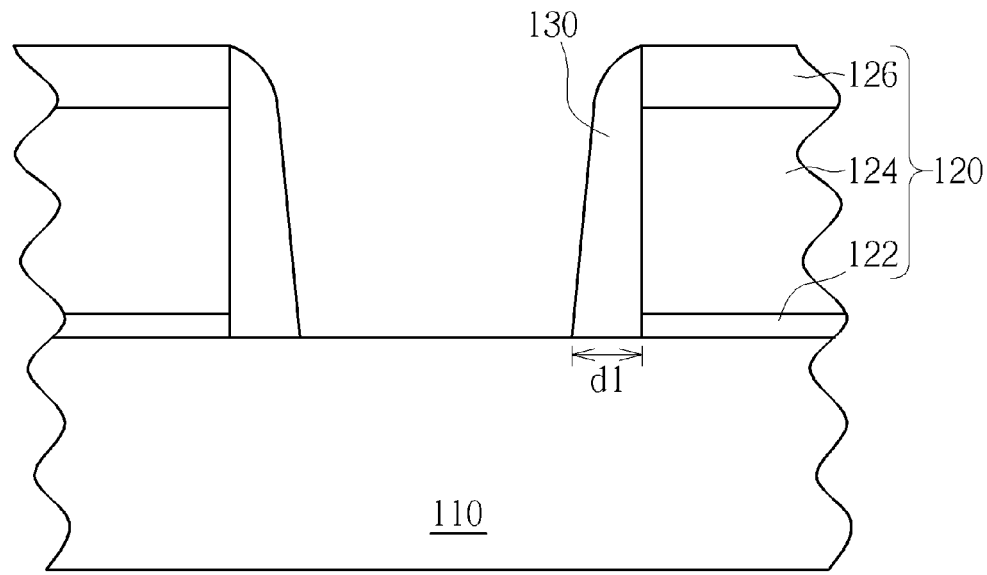

Please refer now to the Step S2 of FIG. 1—forming a spacer on the substrate beside the gate to define the position of an epitaxial structure, which is illustrated in FIG. 3. A spacer 130 is formed on the substrate 110 beside each of the gates 120 respectively to define the position of a later formed epitaxial structure in the substrate 110 beside the gate 120. The spacer 130 may be a single layer such as a silicon nitride layer or a silicon oxynitride layer etc, or a dual layer such as a silicon oxide/silicon nitride layer, but it is not limited thereto. More precisely, the method of forming the spacer includes the following. As shown in FIG. 2 and FIG. 3, a spacer material 130' is deposited on the gates 120 and the substrate 110 and then a second etching process E2 is performed to form the spacer 130. In one case, the second etching process E2 may further include over-etching of a part of the substrate 110 between the gates 120 after the spacer 130 is formed. In a preferred embodiment, the second etching process E2 may include importing carbon tetrafluoride ($CF_4$) gas, which may include $CF_4$/He—$O_2$/Ar, but it is not limited thereto. It is emphasized that the spacer 130 represents a spacer for defining and forming an epitaxial structure, thereby forming other spacers before/after the spacer 130 is formed to form a lightly doped source/drain region (as shown) or a source/drain region (as shown). For simplifying and clarifying the present invention, FIGS. 2-6 just depict the spacer 130 for forming an epitaxial structure.

Please refer now to the Step S3 of FIG. 1—measuring a thickness of the spacer through a non-destructive measurement method such as an electron microscopy method or a spectrum detection method to measure the spacer beside the gate in a test area or a grain area, that is illustrated in FIG. 3. A thickness d1 of the spacer 130 is measured, wherein the thickness d1 represents the bottom surface of the spacer 130 connecting the substrate 110. The spacer 130 generally has a boat-shaped cross-sectional profile (or another shaped cross-sectional profile having a non-vertical sidewall), and the position of a later formed recess and an epitaxial structure formed therein can be defined by the thickness d1 of the bottom surface of the spacer 130 connecting the substrate 110.

Figure 4:
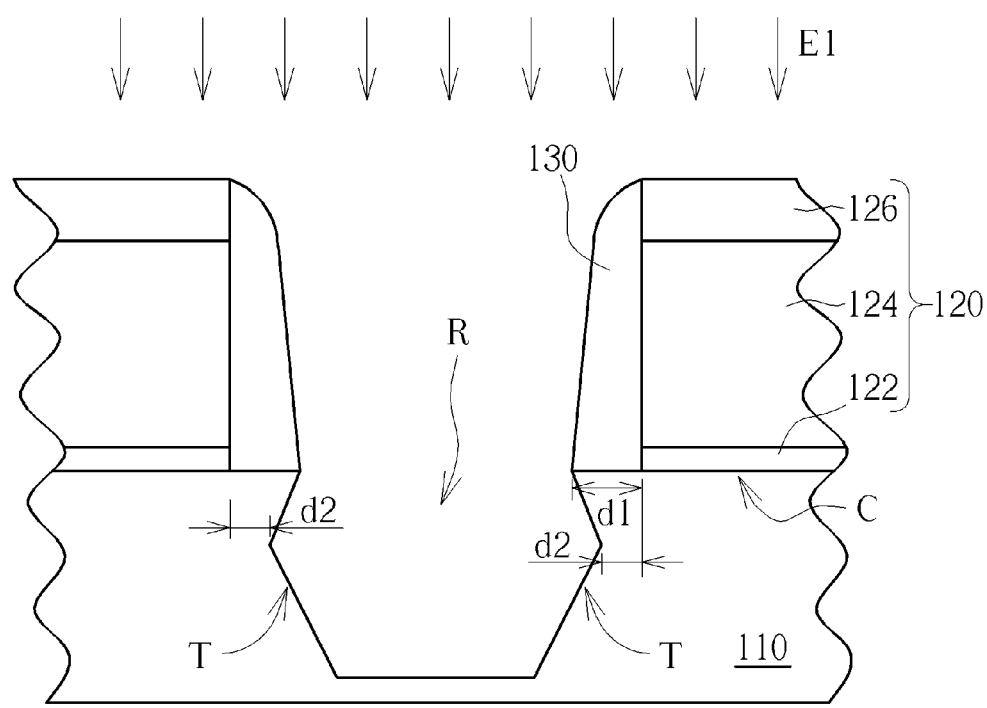

Please refer now to the Step S4 of FIG. 1—setting the etching time of a first etching process according to the thickness of the spacer; and then to the Step S5 of FIG. 1—performing the first etching process to form a recess in the substrate beside the spacer, which are illustrated in FIG. 4. A first etching process E1 is performed for etching a recess R. The first etching process E1 may include at least a vertical etching step and at least a lateral etching step, wherein the vertical etching step is used for forming the vertical depth of the recess R while the lateral etching step is used for forming the shape and the volume of the recess R and for controlling the distance d2 of the recess R to the gate 120. The thickness d1 and the distance d2 are an important factor that affects the stresses in a gate channel C induced by a later formed epitaxial structure, wherein the additional stresses induced by the parts around the thickness d1 and the distance d2 directly affect the electrical performances of a formed semiconductor component, such as a transistor. For instance, the relation of the threshold voltage (VT) of a transistor formed by the gate 120 versus the distance of a later formed epitaxial structure on the gate 120 is 22 millivolts (mV)/10 angstroms; in other words, when the distance of a later formed epitaxial structure to the gate 120 changes by 10 angstroms, the threshold voltage (VT) of a transistor formed by the gate 120 changes by 22 millivolts (mV) accordingly. For instance, when the threshold voltage of a transistor formed by nowadays processes is of 347 millivolts (mV), a change in the distance of a later formed epitaxial structure to the gate 120 of 10 angstroms will cause a 6.35% offset of the threshold voltage. This change will affect the electrical performances of the formed transistor dramatically. In another embodiment, the recess R may have a diamond shaped cross-sectional profile, an octagonal shaped cross-sectional profile or other shapes, so that the closest part of the recess R to the gate 120 may include a plurality of peaks or sidewalls. No matter which shape the recess R has, the etching time of the first etching process E1 can be adjusted according to the thickness of the spacer 130 to control the distance of the recess R to the gate 120 precisely.

Moreover, the horizontal distance of the peaks T of recess R to the gate 120 is related to the thickness d1 of the spacer 130 and the first etching process E1, especially for the lateral etching step of the first etching process E1. When the thickness d1 of the spacer 130 is larger, the etching time of the first etching process E1 (especially for the lateral etching step of the first etching process E1) is longer to approach a predetermined horizontal distance d2. In contrast, when the thickness d1 of the spacer 130 is thinner, the etching time of the first etching process E1 (especially for the lateral etching step of the first etching process E1) is shorter to approach a predetermined horizontal distance d2. Therefore, processes can be controlled, the recess R with a desired distance d2 of the recess R (epitaxial structure) to the gate 120 and the thickness d1 of the spacer 130 can be obtained in the present invention by setting the etching time of the first etching process E1 according to the measured thickness d1 of the spacer 130.

In one case, the etching time of the first etching process E1 can be adjusted with a cardinal number as unit considering multiples of 10 angstroms. For example, when the thickness of the spacer 130 increases/decreases by 10×n angstroms from a predetermined thickness, the etching time of the first etching process increases/decreases by 1×n seconds from a predetermined etching time, wherein n is a positive integer, so that the horizontal distance d2 between the recess R and the gate 120 can be approached. Therefore, a same thickness d1 of the spacer 130 can be obtained in the following two circumstances: when a predetermined thickness of the spacer 130 is 188 angstroms and the predetermined etching time of the first etching process E1 is increased by 1 second, and when a predetermined thickness of a spacer 130 is 198 angstroms, and the predetermined etching time of the first etching process E1 is increased by 2 seconds. This means that the thickness d1 of the spacer 130 and the etching time of the first etching process E1 (especially for the lateral etching step of the first etching process E1) have a linear relation. Thus, the recess R having a desired horizontal distance d2 and a desired thickness d1 of the spacer 130 can be formed by adjusting the etching time of the first etching process E1 according to the thickness d1 of the spacer 130. Furthermore, the offset of the thickness d1 of the spacer 130 can be compensated by adjusting the etching time of the first etching process E1 to obtain a predetermined recess R having a desired horizontal distance d2 and a predetermined thickness d1 of the spacer 130. Therefore, the variation of the thickness d1 of the spacer 130 caused by practical circumstances, such as processes performed by unstable processing parameters, or the differences between different machines, can be compensated in the present invention, thereby correcting semiconductor structures, such as formed transistors, to be more accurate.

In this embodiment, the first etching process E1 may include sequentially performing a vertical etching step, a lateral etching step and a vertical etching step. In a preferred embodiment, the two vertical etching steps all import hydrogen bromide (HBr), and the lateral etching step imports sulfur hexafluoride (SF6), but it is not limited thereto. Moreover, an etching process may include sequentially performing the second etching process E2 and first etching process E1, i.e. performing the second etching process E2 to form the spacer 130 and possibly further over-etch parts of the substrate 110 between the gate 120 selectively, measuring the thickness d1 of the spacer 130, and then performing the first etching process E1 to form a recess R in the substrate 110 beside the spacer 130. In this embodiment, the second etching process E2 and the first etching process E1 are all dry etching processes. Because of the non-isotropic etching characteristic of dry etching processes, they are more suitable to etch the spacer 130 having a uniform boat or other shaped cross-sectional profile and to control the depth, the shape and the distance to the gate 120 of the recess R than wet etching processes having isotropic etching characteristic.

In this embodiment, the first etching process E1 (especially for the lateral etching step of the first etching process E1) is performed after the thickness d1 is measured. However, in another embodiment, the thickness d1 of the spacer 130 may be measured during the first etching process E1. For instance, the first etching process E1 may include a vertical etching step, a lateral etching step and a vertical etching step, so that the order of processes may be performing the vertical etching step, measuring the thickness d1 of the spacer 130, performing the lateral etching step and performing the vertical etching step.

Please refer now to Step S6 of FIG. 1—i.e. forming an epitaxial structure in the recess, which is illustrated in FIG. 5. An epitaxial process is performed to form an epitaxial structure 140 in the recess R. In this embodiment, the epitaxial structure 140 may be a silicon germanium epitaxial structure used for forming a PMOS transistor; in another embodiment, the epitaxial structure 140 may be a silicon carbide epitaxial structure used for forming an NMOS transistor, but it is not limited thereto.

To summarize, the present invention provides a method of controlling an etching process for forming an epitaxial structure, which sets the etching time of the first etching process (especially for the lateral etching step of the first etching process) according to the thickness of the bottom surface of the spacer connecting the substrate, to form the recess having the desired recess to gate distance for forming the epitaxial structure therein. Moreover, the offset of the thickness of the spacer can be first measured, and the offset can be compensated by adjusting the etching time of the first etching process to form a predetermined epitaxial structure to gate distance. Therefore, processes can be controlled and the desired epitaxial structure to gate distance can be obtained by applying the present invention, including compensating offsets of the thickness of the spacer caused by unstable processing parameters or by the differences between different platform machines, thereby correcting semiconductor structures, such as formed transistors, to be more accurate.

More precisely, the relation of the thickness of the bottom surface of the spacer connecting the substrate versus the etching time of the first etching process has a liner relation. For instance, as the thickness of the spacer increases/decreases by 10×n angstroms from a predetermined thickness, the etching time of the first etching process increases/decreases by 1×n seconds from a predetermined etching time, wherein n is a positive integer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of controlling an etching process for forming an epitaxial structure comprising:
    providing a substrate having a gate thereon;
    forming a spacer on the substrate beside the gate to define the position of the epitaxial structure;
    measuring a thickness of the spacer;
    setting the etching time of a first etching process according to the thickness;
    performing the first etching process to form a recess in the substrate beside the spacer; and
    forming the epitaxial structure in the recess.

2. The method of controlling an etching process for forming an epitaxial structure according to claim 1, wherein the etching process comprises a dry etching process.

3. The method of controlling an etching process for forming an epitaxial structure according to claim 1, wherein the first etching process comprises at least a vertical etching step and at least a lateral etching step.

4. The method of controlling an etching process for forming an epitaxial structure according to claim 3, wherein the etching time of the first etching process is the etching time of the lateral etching step.

5. The method of controlling an etching process for forming an epitaxial structure according to claim 3, wherein the first etching process comprises sequentially performing a vertical etching step, a lateral etching step and a vertical etching step.

6. The method of controlling an etching process for forming an epitaxial structure according to claim 5, wherein the two vertical etching steps comprise importing hydrogen bromide (HBr) gas.

7. The method of controlling an etching process for forming an epitaxial structure according to claim 5, wherein the lateral etching step comprises importing sulfur hexafluoride (SF6) gas.

8. The method of controlling an etching process for forming an epitaxial structure according to claim 1, wherein the method of forming the spacer comprises:
    depositing a spacer material on the gate and the substrate, and
    performing a second etching process to form the spacer.

9. The method of controlling an etching process for forming an epitaxial structure according to claim 8, wherein the second etching process further comprises over-etching the spacer wherein the substrate acts as a etch stop layer.

10. The method of controlling an etching process for forming an epitaxial structure according to claim 8, wherein the second etching process comprises importing carbon tetrafluoride ($CF_4$) gas.

11. The method of controlling an etching process for forming an epitaxial structure according to claim 8, wherein the etching process comprises the first etching process and the second etching process.

12. The method of controlling an etching process for forming an epitaxial structure according to claim 1, wherein the method of setting the etching time of a first etching process according to the thickness comprises:

when the thickness of the spacer increases/decreases by 10×n angstroms from a predetermined thickness, the etching time of the first etching process increases/decreases by 1×n seconds from a predetermined etching time, wherein n is a positive integer.

13. The method of controlling an etching process for forming an epitaxial structure according to claim 1, wherein the relation of the threshold voltage (Vt) of a transistor formed by the gate versus the epitaxial structure to gate distance is 22 millivolts (mV)/10 angstroms.

\* \* \* \* \*